United States Patent
Lin

(10) Patent No.: US 12,260,933 B2
(45) Date of Patent: Mar. 25, 2025

(54) DATA RECEIVING CIRCUIT, DATA RECEIVING SYSTEM, AND MEMORY DEVICE

(71) Applicant: CHANGXIN MEMORY TECHNOLOGIES, INC., Hefei (CN)

(72) Inventor: Feng Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 189 days.

(21) Appl. No.: 18/152,919

(22) Filed: Jan. 11, 2023

(65) Prior Publication Data

US 2023/0420019 A1 Dec. 28, 2023

Related U.S. Application Data

(63) Continuation of application No. PCT/CN2022/115546, filed on Aug. 29, 2022.

(30) Foreign Application Priority Data

Jun. 23, 2022 (CN) .......................... 202210725117.0

(51) Int. Cl.
*G11C 7/22* (2006.01)
*G11C 5/14* (2006.01)
*G11C 7/10* (2006.01)

(52) U.S. Cl.
CPC .............. *G11C 7/222* (2013.01); *G11C 5/147* (2013.01); *G11C 7/1063* (2013.01)

(58) Field of Classification Search
CPC ....... G11C 7/222; G11C 5/147; G11C 7/1063; G11C 7/1048; G11C 11/4093; G11C 2207/2254; G11C 7/1087; G11C 7/1084
(Continued)

(56) References Cited

U.S. PATENT DOCUMENTS 7,233,616 B1 * 6/2007 Nayler .............. H04L 25/03057
375/232
8,149,953 B2 * 4/2012 Kim .................. H03K 19/09425
375/348
(Continued)

FOREIGN PATENT DOCUMENTS

CN         1913505 A     2/2007
CN       100401269 C     7/2008
(Continued)

OTHER PUBLICATIONS

KR Office Action cited in KR10-2022-7035492, mailed Sep. 11, 2023, 13 pages.
(Continued)

*Primary Examiner* — Michael T Tran
(74) *Attorney, Agent, or Firm* — Kilpatrick Townsend & Stockton LLP

(57) ABSTRACT

The present disclosure provides a data receiving circuit, a data receiving system, and a memory device. The data receiving circuit includes: a receiving module, configured to receive a data signal and a reference signal, compare the data signal and the reference signal in response to a sampling clock signal, and output a first output signal and a second output signal; and a decision feedback equalization module, connected to a feedback node of the receiving module, and configured to perform a decision feedback equalization on the receiving module on the basis of a feedback signal to adjust the first output signal and the second output signal, wherein the feedback signal is obtained on the basis of data received previously, and an adjustment capability of the decision feedback equalization module to the first output signal and the second output signal is adjustable.

23 Claims, 6 Drawing Sheets

(58) Field of Classification Search
USPC .......................................... 365/233.1, 189.05
See application file for complete search history.

(56) References Cited

U.S. PATENT DOCUMENTS

| | | | |
|---|---|---|---|
| 10,825,493 | B2 | 11/2020 | Karim |
| 11,323,117 | B1* | 5/2022 | Tanguay ............... H03K 19/096 |
| 2005/0265440 | A1 | 12/2005 | Sohn |
| 2006/0034358 | A1 | 2/2006 | Okamura |
| 2008/0089155 | A1 | 4/2008 | Bae |
| 2009/0058476 | A1 | 3/2009 | Oh et al. |
| 2009/0129459 | A1 | 5/2009 | Kim et al. |
| 2010/0327924 | A1* | 12/2010 | Hasegawa ......... H04L 25/03885 327/155 |
| 2012/0027074 | A1* | 2/2012 | Raghavan ......... H04L 25/03885 375/233 |
| 2012/0063242 | A1 | 3/2012 | Kim et al. |
| 2013/0107933 | A1* | 5/2013 | Hu ......................... H04L 27/01 330/69 |
| 2013/0107935 | A1* | 5/2013 | Zhou ................. H04L 25/03248 375/317 |
| 2015/0312060 | A1 | 10/2015 | Sinha |
| 2017/0373889 | A1* | 12/2017 | Sakai ..................... H03K 3/037 |
| 2018/0351770 | A1* | 12/2018 | Chiu ..................... H04L 7/0041 |
| 2019/0068412 | A1* | 2/2019 | Hsieh ............... H04L 25/03057 |
| 2020/0105319 | A1 | 4/2020 | Mostofa et al. |
| 2020/0110716 | A1* | 4/2020 | Mozak ................ G06F 13/1689 |
| 2020/0153422 | A1 | 5/2020 | Lee |
| 2020/0358590 | A1 | 11/2020 | Kim |
| 2021/0174844 | A1 | 6/2021 | Choi et al. |
| 2021/0266201 | A1 | 8/2021 | Hu |
| 2021/0319826 | A1 | 10/2021 | Waldrop et al. |
| 2022/0077830 | A1 | 3/2022 | Duan et al. |
| 2022/0141054 | A1 | 5/2022 | Seong et al. |
| 2024/0129167 | A1* | 4/2024 | Tsai .................. H04L 25/03146 |

FOREIGN PATENT DOCUMENTS

| | | |
|---|---|---|
| CN | 111159081 A | 5/2020 |
| CN | 111916123 A | 11/2020 |
| CN | 112332818 A | 2/2021 |
| CN | 112753071 A | 5/2021 |
| CN | 113129987 A | 7/2021 |
| CN | 113517011 A | 10/2021 |
| CN | 113556104 A | 10/2021 |
| CN | 113517011 B | 4/2022 |
| CN | 111159081 B | 8/2023 |
| KR | 1020090044055 A | 5/2009 |
| TW | I409635 B | 9/2013 |

OTHER PUBLICATIONS

European Patent Office, Extended European Search Report Issued in Application No. 22792738.1, Apr. 23, 2024, Germany, 10 pages.
Taiwan Patent Office, Office Action Issued in Application No. 111142520, Jul. 4, 2024, 10 pages.
International Search Report cited in PCT/CN2022/105291 mailed Dec. 19, 2022, 9 pages.
International Search Report cited in PCT/CN2022/115546 mailed Jan. 18, 2023, 9 pages.
Japanese Patent Office, Office Action Issued in Application No. 2022-562529, Aug. 6, 2024, 12 pages.

* cited by examiner

DATA RECEIVING CIRCUIT, DATA RECEIVING SYSTEM, AND MEMORY DEVICE

CROSS-REFERENCE TO RELATED APPLICATIONS

This is a continuation of International Application No. PCT/CN2022/115546, filed on Aug. 29, 2022, which claims the priority to Chinese Patent Application No. 202210725117.0, titled "DATA RECEIVING CIRCUIT, DATA RECEIVING SYSTEM, AND MEMORY DEVICE" and filed on Jun. 23, 2022. The entire contents of International Application No. PCT/CN2022/115546 and Chinese Patent Application No. 202210725117.0 are incorporated herein by reference.

TECHNICAL FIELD

The present disclosure relates to, but is not limited to, a data receiving circuit, a data receiving system, and a memory device.

BACKGROUND

In memory applications, as the signal transmission rate becomes faster and faster, the channel loss has a greater impact on the signal quality, which may easily lead to intersymbol interference. At present, an equalization circuit is usually configured to compensate for a channel, and the equalization circuit may select a continuous time linear equalizer (CTLE) or a decision feedback equalizer (DFE).

However, the equalization circuit used currently has a limited capability to adjust a signal, and the adjustment accuracy of the equalization circuit to the signal needs to be improved.

SUMMARY

An overview of the subject described in detail in the present disclosure is provided below. This overview is not intended to limit the protection scope of the claims.

Embodiments of the present disclosure provide a data receiving circuit, a data receiving system, and a memory device.

A first aspect of the present disclosure provides a data receiving circuit, including: a receiving module, configured to receive a data signal and a reference signal, compare the data signal and the reference signal in response to a sampling clock signal, and output a first output signal and a second output signal; and a decision feedback equalization module, connected to a feedback node of the receiving module, and configured to perform a decision feedback equalization on the receiving module on the basis of a feedback signal to adjust the first output signal and the second output signal, wherein the feedback signal is obtained on the basis of data received previously, and an adjustment capability of the decision feedback equalization module to the first output signal and the second output signal is adjustable.

A second aspect of the present disclosure provides a data receiving system, including: a plurality of cascaded data transmission circuits, wherein each of the data transmission circuits includes the data receiving circuit according to the first aspect and a latch circuit connected to the data receiving circuit, and the data receiving circuit is connected to a data port for receiving a data signal; a previous-stage data transmission circuit is connected to a decision feedback equalization module of a next-stage data transmission circuit, and an output of the previous-stage data transmission circuit serves as a feedback signal of the decision feedback equalization module of the next-stage data transmission circuit; and a last-stage data transmission circuit is connected to a decision feedback equalization module of a first-stage data transmission circuit, and an output of the last-stage data transmission circuit serves as a feedback signal of the decision feedback equalization module of the first-stage data transmission circuit.

A third aspect of the present disclosure provides a memory device, including: a plurality of data ports; and a plurality of the data receiving systems according to the second aspect, wherein each of the data receiving systems corresponds to one of the data ports.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

It can be known from the background that the adjustment capability of the equalization circuit to the signals needs to be improved.

The embodiments of the present disclosure provide a data receiving circuit, a data receiving system, and a memory device. In the data receiving circuit, the decision feedback equalization module is integrated in the data receiving circuit, and is configured to adjust the first output signal and the second output signal to reduce intersymbol interference between signals outputted by the data receiving circuit. Moreover, the embodiments of the present disclosure are beneficial to adjust the signals outputted by the data receiving circuit using a smaller circuit layout area and lower power consumption, and reduce, by flexibly controlling the adjustment capability of the decision feedback equalization module to the first output signal and the second output signal, the influence of the intersymbol interference of the data received by the data receiving circuit on the data receiving circuit, thereby improving the receiving performance of the data receiving circuit, and reducing the influence of the intersymbol interference of the data on the accuracy of the signal outputted by the data receiving circuit.

Figure 1:
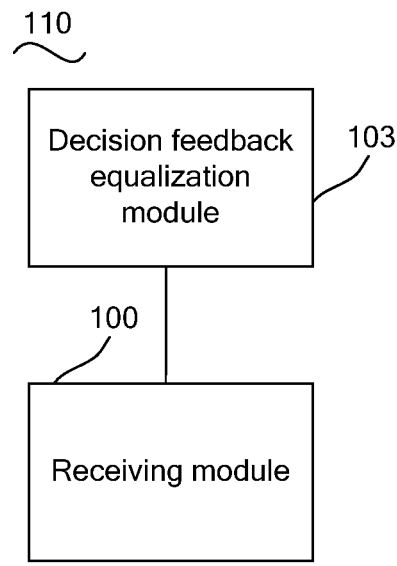
FIG. 1 is a functional block diagram of a data receiving circuit according to one embodiment of the present disclosure.
Figure 3:
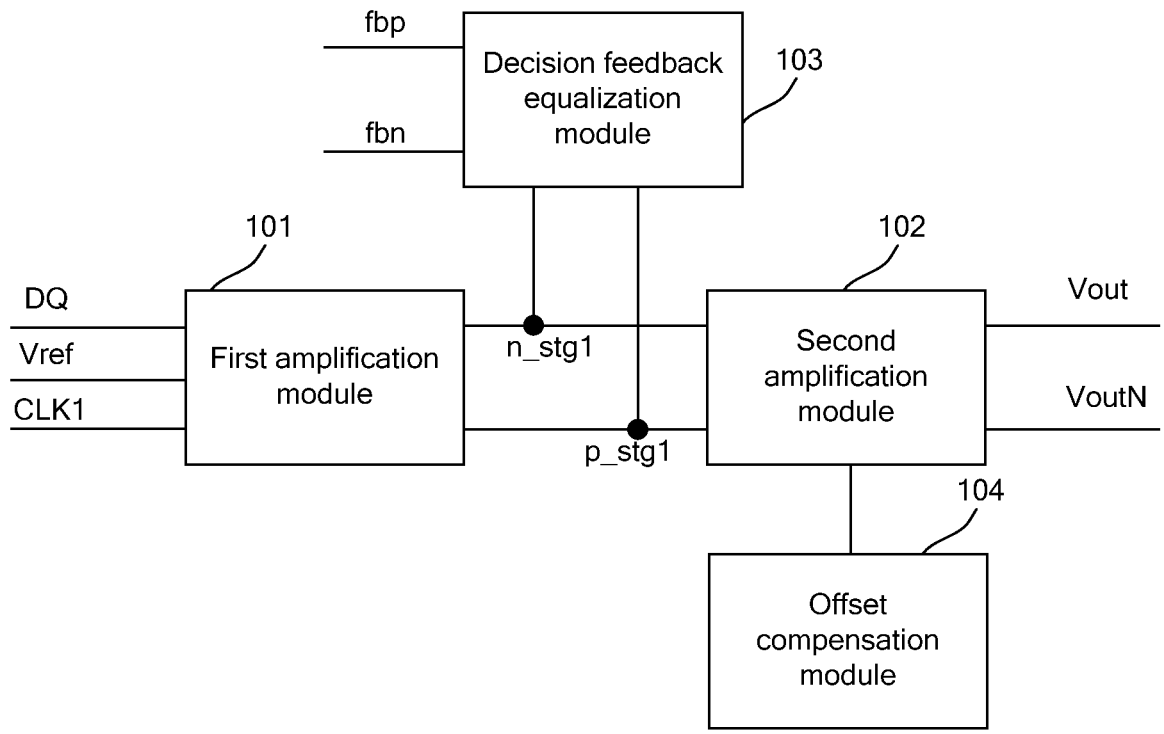
FIG. 3 and FIG. 4 are another two functional block diagrams of a data receiving circuit according to one embodiment of the present disclosure.
Figure 4:
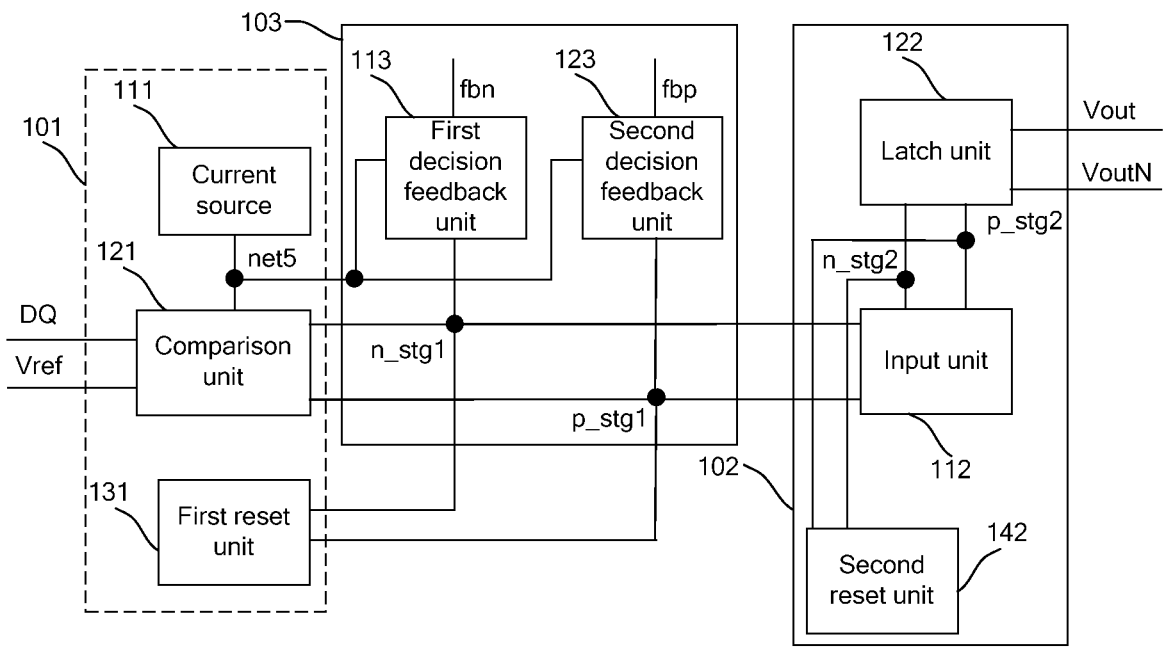
Figure 5:
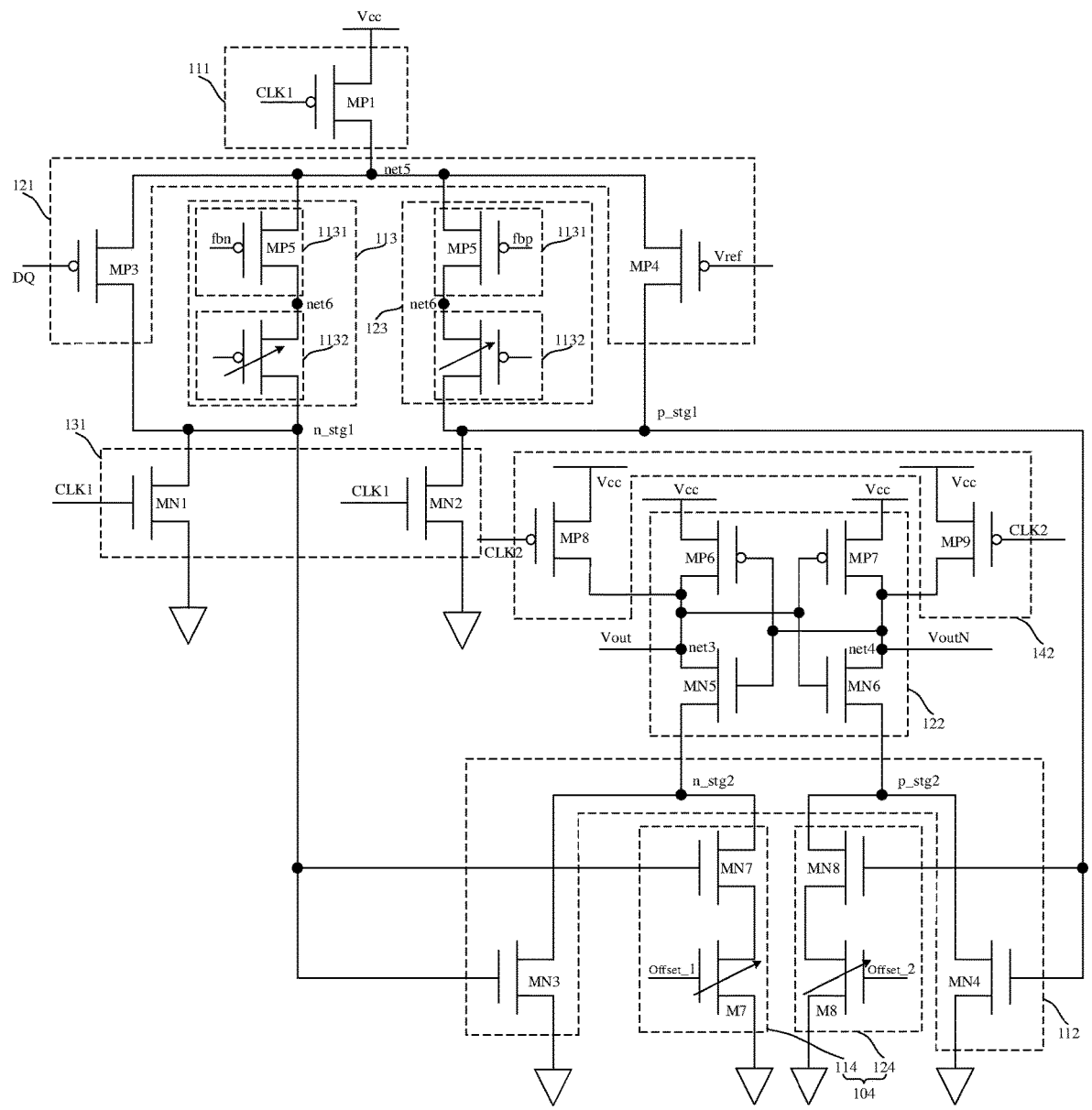
FIG. 5 is a schematic diagram of a circuit structure of a data receiving circuit according to one embodiment of the present disclosure.
Figure 6:
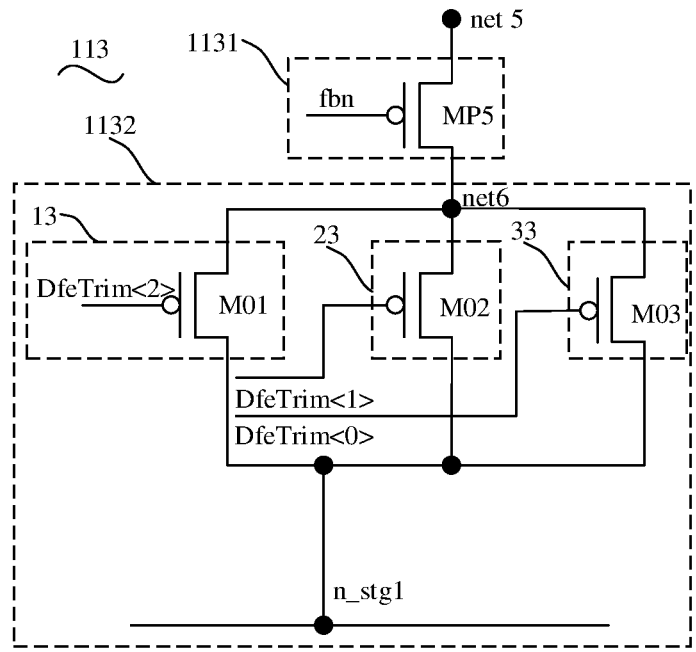
FIG. 6 and FIG. 7 are schematic diagrams of two circuit structures of a first decision feedback unit in a data receiving circuit according to one embodiment of the present disclosure.
Figure 7:
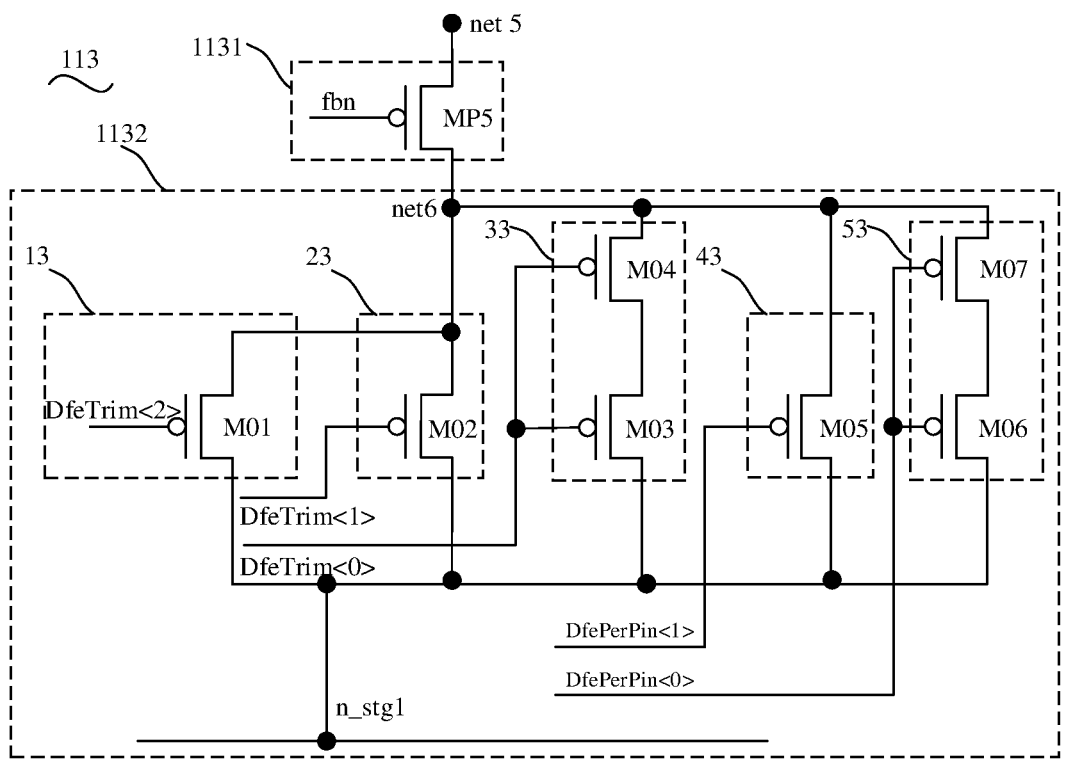
Figure 8:
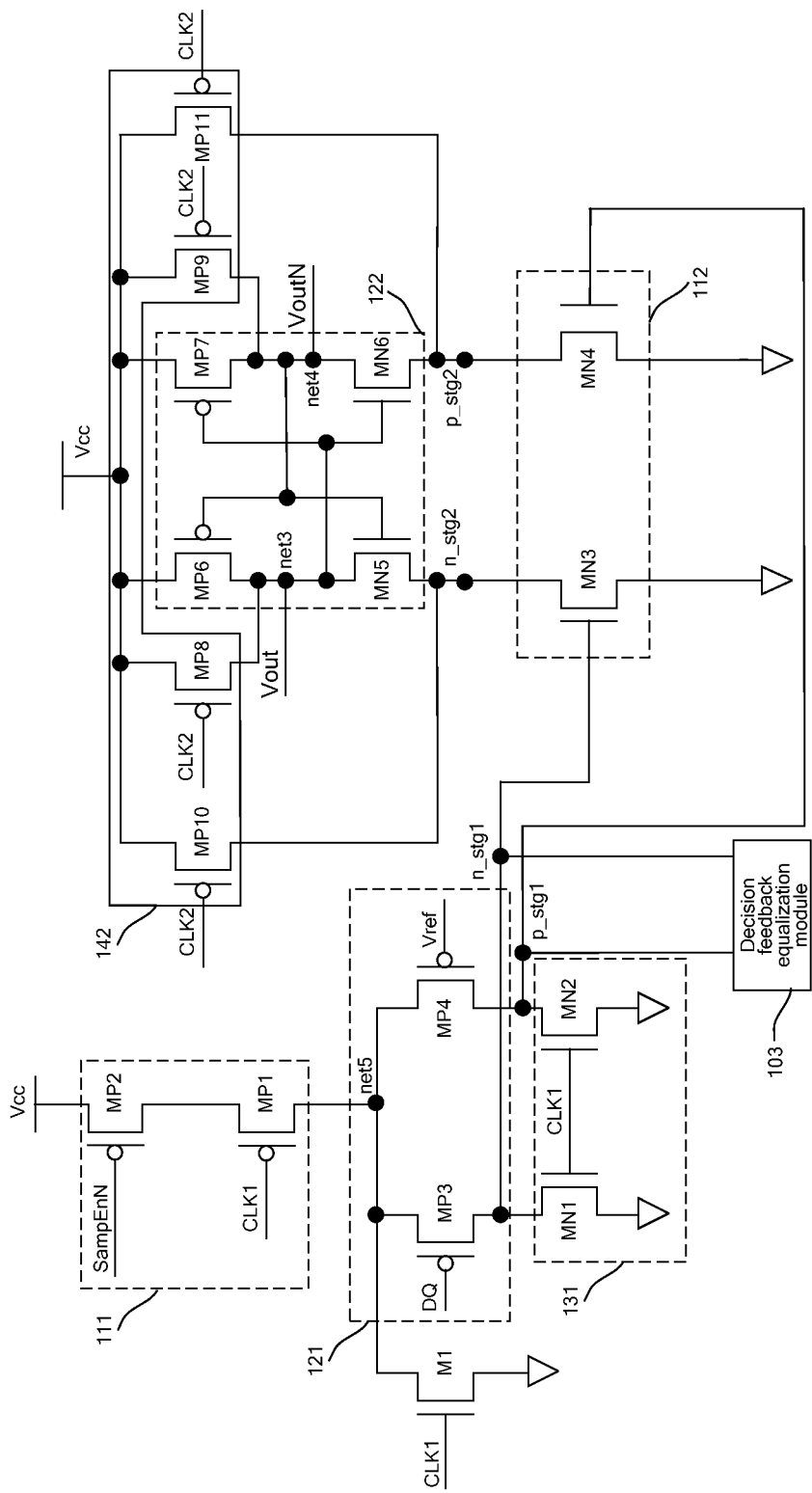
FIG. 8 and FIG. 9 are schematic diagrams of another two circuit structures of a data receiving circuit according to one embodiment of the present disclosure.
Figure 9:
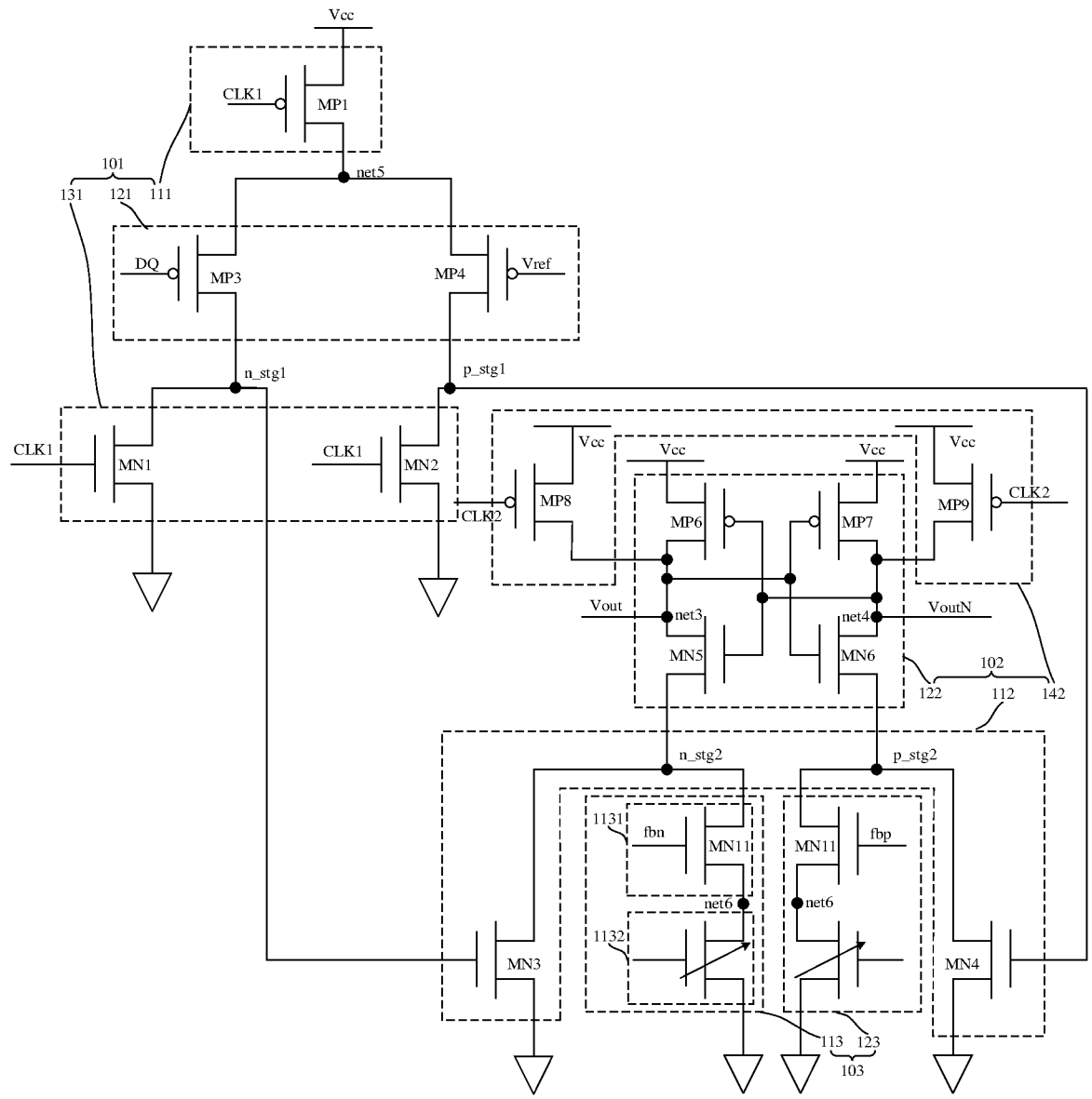

One embodiment of the present disclosure provides a data receiving circuit. The data receiving circuit provided by one embodiment of the present disclosure will be described in detail below with reference to the accompanying drawings. FIG. 1 is a functional block diagram of a data receiving circuit according to one embodiment of the present disclosure; FIG. 3 and FIG. 4 are another two functional block diagrams of a data receiving circuit according to one embodiment of the present disclosure; FIG. 5 is a schematic diagram of a circuit structure of a data receiving circuit according to one embodiment of the present disclosure; FIG. 6 and FIG. 7 are schematic diagrams of two circuit structures of a first decision feedback unit in a data receiving circuit according to one embodiment of the present disclosure; and FIG. 8 and FIG. 9 are schematic diagrams of another two circuit structures of a data receiving circuit according to one embodiment of the present disclosure.

Referring to FIG. 1, the data receiving circuit 110 includes: a receiving module 100 configured to receive a data signal DQ and a reference signal Vref, compare the data signal DQ and the reference signal Vref in response to a sampling clock signal CLK1, and output a first output signal Vout and a second output signal VoutN; and a decision feedback equalization module 103 connected to a feedback node of the receiving module 100, and configured to perform decision feedback equalization on the receiving module 100 on the basis of a feedback signal to adjust the first output signal Vout and the second output signal VoutN, where the feedback signal is obtained on the basis of data received previously, and an adjustment capability of the decision feedback equalization module 103 to the first output signal Vout and the second output signal VoutN is adjustable.

The decision feedback equalization module 103 is integrated in the data receiving circuit, which is beneficial to adjust the signals outputted by the data receiving circuit using a smaller circuit layout area and lower power consumption. Moreover, the adjustment capability of the decision feedback equalization module 103 provided in the embodiments of the present disclosure to the first output signal Vout and the second output signal VoutN is adjustable. It can be understood that, when the data signal DQ and/or the reference signal Vref received by the receiving module 100 change, the adjustment capability of the decision feedback equalization module 103 to the first output signal Vout and the second output signal VoutN may be flexibly controlled, to reduce the influence of the intersymbol interference of the data received by the data receiving circuit on the data receiving circuit, improve the receiving performance of the data receiving circuit, and reduce the influence of the intersymbol interference of the data on the accuracy of the signals outputted by the data receiving circuit.

It should be noted that, the connection between the decision feedback equalization module 103 and the feedback node of the receiving module 100 includes at least the following two examples.

In some embodiments, referring to FIG. 3, the receiving module 100 (referring to FIG. 1) may include: a first amplification module 101 configured to receive the data signal DQ and the reference signal Vref, compare the data signal DQ and the reference signal Vref in response to the sampling clock signal CLK1, output a first voltage signal through a first node n_stg1, and output a second voltage signal through a second node p_stg1; and a second amplification module 102 connected to the first node n_stg1 and the second node p_stg1, and configured to amplify a voltage difference between the first voltage signal and the second voltage signal, output the first output signal Vout through a third node net3 (referring to FIG. 5), and output the second output signal VoutN through a fourth node net4 (referring to FIG. 5); where, the feedback node includes a first feedback node and a second feedback node, the first node n_stg1 serves as the first feedback node, the second node p_stg1 serves as the second feedback node, and the decision feedback equalization module 103 is configured to perform the decision feedback equalization on the first node n_stg1 and the second node p_stg1 on the basis of the feedback signal to adjust the first voltage signal and the second voltage signal.

It should be noted that, the second amplification module 102 receives the first voltage signal and the second voltage signal, and amplify the voltage difference between the first voltage signal and the second voltage signal to output the first output signal Vout and the second output signal VoutN. That is, the first output signal Vout and the second output signal VoutN are affected by the first voltage signal and the second voltage signal, and the decision feedback equalization module 103 adjusts the first voltage signal and the second voltage signal on the basis of the feedback signal, which may also further adjust the first output signal Vout and the second output signal VoutN. Moreover, the adjustment of the first voltage signal and the second voltage signal by the decision feedback equalization module 103 is described in detail later with reference to specific circuit diagrams.

In some embodiments, still referring to FIG. 3, the data receiving circuit may further include: an offset compensation module 104 connected to the second amplification module 102 and configured to compensate for an offset voltage of the second amplification module 102. It should be noted that, the specific connection relationship between the offset compensation module 104 and the second amplification module 102 is described in detail later with reference to specific circuit diagrams.

In some other embodiments, referring to FIG. 9, the receiving module 100 (referring to FIG. 1) may include: a first amplification module 101 configured to receive the data signal DQ and the reference signal Vref, compare the data signal DQ and the reference signal Vref in response to the sampling clock signal CLK1, output a first voltage signal through a first node n_stg1, and output a second voltage signal through a second node p_stg1; and a second amplification module 102 connected to the first node n_stg1 and the second node p_stg1, configured to amplify a voltage difference between the first voltage signal and the second voltage signal, output the first output signal Vout through a third node net3 and output the second output signal VoutN through a fourth node net4, and provided with a first internal node n_stg2 and a second internal node p_stg2, the first output signal Vout and the second output signal VoutN being obtained on the basis of a signal of the first internal node n_stg2 and a signal of the second internal node p_stg2; where, the feedback node includes a first feedback node and a second feedback node, the first internal node n_stg2 serves as the first feedback node, the second internal node p_stg2 serves as the second feedback node, and the decision feedback equalization module 103 is configured to perform the decision feedback equalization on the first internal node n_stg2 and the second internal node p_stg2 on the basis of the feedback signal.

It should be noted that, the voltage signal at the first internal node n_stg2 is a third voltage signal, and the voltage signal at the second internal node p_stg2 is a fourth voltage signal. The decision feedback equalization module 103 is configured to perform the decision feedback equalization on the first internal node n_stg2 and the second internal node p_stg2 on the basis of the feedback signal. That is, the decision feedback equalization module 103 adjusts the third voltage signal and the fourth voltage signal. The first output signal Vout and the second output signal VoutN are based on the third voltage signal and the fourth voltage signal, and the decision feedback equalization module 103 adjusts the third voltage signal and the fourth voltage signal on the basis of the feedback signal, which may also further adjust the first output signal Vout and the second output signal VoutN. Moreover, the adjustment of the third voltage signal and the fourth voltage signal by the decision feedback equalization module 103 is described in detail later with reference to specific circuit diagrams.

In some embodiments, the data receiving circuit may further include: an offset compensation module connected to the first amplification module and configured to compensate for an offset voltage of the first amplification module. It should be noted that, the specific connection relationship between the offset compensation module and the first amplification module is described in detail later.

In the above two examples, the data receiving circuit employs two stages of amplification modules, namely the first amplification module 101 and the second amplification module 102 for processing the data signal DQ and the reference signal Vref, which is conducive to enhancing the amplification capability of the data receiving circuit, increasing the voltage amplitudes of the first output signal Vout and the second output signal VoutN, and facilitating subsequent circuit processing. In addition, the decision feedback equalization module 103 is configured to reduce the intersymbol interference by equivalently adjusting the data signal DQ.

The specific structure of the data receiving circuit according to one embodiment of the present disclosure is described in detail below with reference to FIG. 4 to FIG. 9. It should be noted that, the following specific description of each module is applicable to the foregoing two examples.

In some embodiments, referring to FIG. 4, the first amplification module 101 may include: a current source 111 connected between a power supply node Vcc (referring to FIG. 5) and a fifth node net5 and configured to provide a current to the fifth node net5 in response to the sampling clock signal CLK1; and a comparison unit 121 connected to the fifth node net5, the first node n_stg1, and the second node p_stg1, and configured to receive the data signal DQ and the reference signal Vref, compare the data signal DQ and the reference signal Vref when the current source 111 provides the current to the fifth node net5 in response to the sampling clock signal CLK1, output the first voltage signal through the first node n_stg1, and output the second voltage signal through the second node p_stg1.

It can be understood that, the comparison unit 121 may control a difference between the current provided to the first node n_stg1 and the current provided to the second node p_stg1 on the basis of a difference between the data signal DQ and the reference signal Vref, to output the first voltage signal and the second voltage signal.

The first amplification module 101 is described in detail below with reference to FIG. 5, FIG. 8, and FIG. 9.

In some embodiments, referring to FIG. 5, FIG. 8, and FIG. 9, the current source 111 may include: a first P-channel metal oxide semiconductor (PMOS) transistor MP1 connected between the power supply node Vcc and the fifth node net5 and provided with a gate for receiving the sampling clock signal CLK1. When the sampling clock signal CLK1 is at a low level, the gate of the first PMOS transistor MP1 receives the sampling clock signal CLK1 to be turned on, and provides the current to the fifth node net5, such that the comparison unit 121 is in an operating state to compare the received data signals DQ and the reference signal Vref.

In some embodiments, still referring to FIG. 8, on the basis that the current source 111 includes the first PMOS transistor MP1, the current source 111 may further include: a second PMOS transistor MP2 connected between the power supply node Vcc and the first PMOS transistor MP1 and provided with a gate for receiving an enable signal SampEnN. When the sampling clock signal CLK1 is at a low level, and the enable signal SampEnN is also at a low level, the first PMOS transistor MP1 and the second PMOS transistor MP2 are both turned on to provide the current to the fifth node net5, such that the comparison unit 121 is in the operating state to compare the received data signals DQ and the reference signal Vref.

In addition, setting the second PMOS transistor MP2 in an on or off state based on the enable signal SampEnN is beneficial to control the second PMOS transistor MP2 to turn off based on the enable signal SampEnN when a device including the data receiving circuit is in a low-power-consumption mode, to turn off the data receiving circuit corresponding to the second PMOS transistor MP2, thereby reducing the overall power consumption of the device including the data receiving circuit.

In some embodiments, referring to FIG. 5, FIG. 8, and FIG. 9, the comparison unit 121 may include: a third PMOS transistor MP3 connected between the fifth node net5 and the first node n_stg1 and provided with a gate for receiving the data signal DQ; and a fourth PMOS transistor MP4 connected between the fifth node net5 and the second node p_stg1 and provided with a gate for receiving the reference signal Vref.

It should be noted that, the level of the data signal DQ and the level of the reference signal Vref are changed asynchronously, such that the turn-on moment of the third PMOS transistor MP3 for receiving the data signal DQ is different from the turn-on moment of the fourth PMOS transistor MP4 for receiving the reference signal Vref; and at the same moment, the turn-on degree of the third PMOS transistor MP3 is different from the turn-on degree of the fourth PMOS transistor MP4. It can be understood that, since the turn-on degree of the third PMOS transistor MP3 is different from the turn-on degree of the fourth PMOS transistor MP4, and the shunt capability of the third PMOS transistor MP3 to the current at the fifth node net5 is also different from the shunt capability of the fourth PMOS transistor MP4 to the current at the fifth node net5, the voltage at the first node n_stg1 is different from the voltage at the second node p_stg1.

In one example, when the level of the data signal DQ is lower than the level of the reference signal Vref, the turn-on degree of the third PMOS transistor MP3 is greater than the turn-on degree of the fourth PMOS transistor MP4, such that the current at the fifth node net5 flows more into a path where the third PMOS transistor MP3 is located, and the current at the first node n_stg1 is greater than the current at the second node p_stg1, and furthermore, the level of the first voltage signal outputted by the first node n_stg1 is high, and the level of the second voltage signal outputted by the second node p_stg1 is low.

In some embodiments, referring to FIG. 4, the first amplification module 101 may further include: a first reset unit 131 connected to the first node n_stg1 and the second node p_stg1 and configured to reset the first node n_stg1 and the second node p_stg1. Thus, after the data receiving circuit completes reception of the data signal DQ and the reference signal Vref and the output of the first output signal Vout and the second output signal VoutN once, the first reset unit 131 may reset the level at the first node n_stg1 and the level at the second node p_stg1 to an original value, such that the data receiving circuit subsequently performs next data reception and processing.

In some embodiments, still referring to FIG. 5, FIG. 8, and FIG. 9, the first reset unit 131 may include: a first N-channel metal oxide semiconductor (NMOS) transistor MN1 connected between the first node n_stg1 and a ground terminal and provided with a gate for receiving the sampling clock signal CLK1; and a second NMOS transistor MN2 connected between the second node p_stg1 and the ground terminal and provided with a gate for receiving the sampling clock signal CLK1.

In one example, when the sampling clock signal CLK1 and the enable signal SampEnN are both at a low level, the first PMOS transistor MP1 and the second PMOS transistor MP2 are both turned on, and at this time, the first NMOS transistor MN1 and the second NMOS transistor MN2 are both turned off, to ensure normal operation of the data receiving circuit. Moreover, the first NMOS transistor MN1 and the second NMOS transistor MN2 may serve as a load of the first amplification module 101 to increase an amplification gain of the first amplification module 101. When the sampling clock signal CLK1 is at a high level, the first PMOS transistor MP1 is turned off, and at this time, the first NMOS transistor MN1 and the second NMOS transistor MN2 are both turned on, to pull down the voltage at the first node n_stg1 and the voltage at the second node p_stg1 to reset the first node n_stg1 and the second node p_stg1.

The decision feedback equalization module 103 is described in detail below through two examples. In one example, the decision feedback equalization module 103 is connected to the first node n_stg1 and the second node p_stg1 in the first amplification module 101, to adjust the first voltage signal and the second voltage signal outputted by the first amplification module 101. In the other example, the decision feedback equalization module 103 is connected to the first internal node n_stg2 and the second internal node p_stg2 in the second amplification module 102, to adjust the voltage at the first internal node n_stg2 and the voltage at the second internal node p_stg2.

In some embodiments, referring to FIG. 5 and FIG. 8, the first node n_stg1 may serve as the first feedback node, the second node p_stg1 serves as the second feedback node, and the feedback signal includes a first feedback signal fbn and a second feedback signal fbp. The decision feedback equalization module 103 may include: a first decision feedback unit 113 connected to the first node n_stg1 and the fifth node net5, and configured to perform the decision feedback equalization on the first node n_stg1 on the basis of the first feedback signal fbn to adjust the first voltage signal; and a second decision feedback unit 123 connected to the second node p_stg1 and the fifth node net5, and configured to perform the decision feedback equalization on the second node p_stg1 on the basis of the second feedback signal fbp to adjust the second voltage signal.

The first decision feedback unit 113 is configured to adjust the current in the third PMOS transistor MP3 to adjust the voltage at the first node n_stg1, which is equivalent to adjust the data signal DQ. The second decision feedback unit 123 is configured to adjust the current in the fourth PMOS transistor MP4 to adjust the voltage at the second node p_stg1, which is equivalent to adjust the reference signal Vref.

In some embodiments, referring to FIG. 6 and FIG. 7, any one of the first decision feedback unit 113 and the second decision feedback unit 123 includes: a switch unit 1131 configured to turn on the fifth node net5 and a sixth node net6 in response to the feedback signal; and an adjustment unit 1132 connected between the sixth node net6 and an output node as one of the first node n_stg1 and the second node p_stg1, and configured to adjust an equivalent resistance between the sixth node net6 and the output node in response to control signals. In the first decision feedback unit 113, the feedback signal is the first feedback signal fbn, the output node is the first node n_stg1, and the switch unit 1131 responds to the first feedback signal fbn; and in the second decision feedback unit 123, the feedback signal is the second feedback signal fbp, the output node is the second node p_stg1, and the switch unit 1131 responds to the second feedback signal fbp.

The switch unit 1131 in the first decision feedback unit 113 is turned on or off on the basis of the first feedback signal fbn, and the switch unit 1131 in the second decision feedback unit 123 is turned on or off on the basis of the second feedback signal fbp. Regardless of whether it is the first decision feedback unit 113 or the second decision feedback unit 123, when the switch unit 1131 is turned on, the adjustment unit 1132 is in the operating state to adjust the voltage at the first node n_stg1 or the second node p_stg1.

In some embodiments, still referring to FIG. 6 and FIG. 7, the switch unit 1131 may include: a fifth PMOS transistor MP5 connected between the fifth node net5 and the sixth node net6 and provided with a gate for receiving the feedback signal.

It should be noted that, in FIG. 6 and FIG. 7, only an example where the gate of the fifth PMOS transistor MP5 receives the first feedback signal fbn and the output node is the first node n_stg1 is given, and the specific structure of the first decision feedback unit 113 is shown. In practical applications, the specific structure of the second decision feedback unit 123 is similar to that of the first decision feedback unit 113, the differences are that the gate of the fifth PMOS transistor MP5 in the second decision feedback unit 123 receives the second feedback signal fbp and the output node is the second node p_stg1, and other places are the same.

In one example, the first feedback signal fbn received by the switch unit 1131 in the first decision feedback unit 113 is at a low level, the fifth PMOS transistor MP5 is turned on, and at this time, the adjustment unit 1132 adjusts the voltage at the first node n_stg1 on the basis of the control signal. In another example, the second feedback signal fbp received by the switch unit 1131 in the second decision feedback unit 123 is at a low level, the fifth PMOS transistor MP5 is turned on, and at this time, the adjustment unit 1132 adjusts the voltage at the second node p_stg1 on the basis of the control signal.

In some embodiments, still referring to FIG. 6 and FIG. 7, the adjustment unit 1132 may include: a plurality of transistor groups connected in parallel between the sixth node net6 and the output node, where control terminals of the different transistor groups receive different control signals, and the different transistor groups have different equivalent resistances. It can be understood that, the difference in equivalent resistances of the different transistor groups makes the overall equivalent resistance of the adjustment unit 1132 flexible and controllable. If the control signals received by the control terminals of the different transistor groups are different, the number of transistor groups in a turn-on state may be selected through the control signals to adjust the overall equivalent resistance of the adjustment unit 1132, thereby flexibly controlling the voltage at the first node n_stg1.

In one example, referring to FIG. 6, the adjustment unit 1132 may include three single MOS transistors connected in parallel between the sixth node net6 and the first node n_stg1, namely a first MOS transistor M01, a second MOS transistor M02, and a third MOS transistor M03 in sequence. A gate of the first MOS transistor M01 receives a first control signal DfeTrim<2>, a gate of the second MOS transistor M02 receives a second control signal DfeTrim<1>, and a gate of the third MOS transistor M03 receives a third control signal DfeTrim<0>.

In some embodiments, referring to FIG. 7, the different transistor groups may include: at least one of the transistor groups including a single MOS transistor; and at least one of the transistor groups including at least two MOS transistors connected in series. In this way, one transistor group may be formed by using several single MOS transistors connected in series having the same channel aspect ratio to adjust the equivalent channel aspect ratio of the transistor group, thereby realizing various designs of the adjustment unit 1132. It can be understood that, the difference in the equivalent channel aspect ratios of the transistor groups may cause the equivalent resistances of the transistor groups to be different.

In one example, the adjustment unit may include a first transistor group, a second transistor group, and a third transistor group connected in parallel between the sixth node and the first node. The first transistor group includes the first MOS transistor, and the gate of the first MOS transistor receives the first control signal. The second transistor group includes the second MOS transistor, and the gate of the second MOS transistor receives the second control signal. The third transistor group includes the third MOS transistor and a fourth MOS transistor connected in series, the fourth MOS transistor is provided with a first terminal connected to the sixth node and a second terminal connected to a first terminal of the third MOS transistor, a second terminal of the third MOS transistor is connected to the first node, and a gate of the third MOS transistor and a gate of the fourth MOS transistor both receive the third control signal.

In another example, referring to FIG. 7, in addition to the first transistor group 13, the second transistor group 23, and the third transistor group 33 included in the above example, the adjustment unit 1132 may further include a fourth transistor group 43 and a fifth transistor group 53 connected in parallel between the sixth node net6 and the first node n_stg1. The first transistor group 13 includes the first MOS transistor M01, and the gate of the first MOS transistor M01 receives the first control signal DfeTrim<2>. The second transistor group 23 includes the second MOS transistor M02, and the gate of the second MOS transistor M02 receives the second control signal DfeTrim<1>. The third transistor group 33 includes the third MOS transistor M03 and the fourth MOS transistor M04 connected in series, the fourth MOS transistor M04 is provided with a first terminal connected to the sixth node net6 and a second terminal connected to a first terminal of the third MOS transistor M03, a second terminal of the third MOS transistor M03 is connected to the first node n_stg1, and a gate of the third MOS transistor M03 and a gate of the fourth MOS transistor M04 both receive the third control signal DfeTrim<0>. The fourth transistor group 43 includes a fifth MOS transistor M05, and a gate of the fifth MOS transistor M05 receives a fourth control signal DfePerPin<1>. The fifth transistor group 53 includes a sixth MOS transistor M06 and a seventh MOS transistor M07 connected in series, the seventh MOS transistor M07 is provided with a first terminal connected to the sixth node net6 and a second terminal connected to a first terminal of the sixth MOS transistor M06, a second terminal of the sixth MOS transistor M06 is connected to the first node n_stg1, and a gate of the sixth MOS transistor M06 and a gate of the seventh MOS transistor M07 both receive a fifth control signal DfePerPin<0>.

It should be noted that, in the above three examples, the first control signal DfeTrim<2>, the second control signal DfeTrim<1>, and the third control signal DfeTrim<0> may be common to all data receiving circuits. That is, for different data receiving circuits connected to different DQ ports, the first control signal DfeTrim<2>, the second control signal DfeTrim<1>, and the third control signal DfeTrim<0> provided to the different data receiving circuits are the same. In addition, in the example shown in FIG. 7, the fourth control signal DfePerPin<1> and the fifth control signal DfePerPin<0> are individually designed according to each DQ port. It can be understood that, for different data receiving circuits of each DQ port, for example, a first data receiving circuit is connected to a port DQ1, and a second data receiving circuit is connected to a port DQ2, the fourth control signal DfePerPin<1> and the fifth control signal DfePerPin<0> in the first data receiving circuit are designed based on the port DQ1, and the fourth control signal DfePerPin<1> and the fifth control signal DfePerPin<0> in the second data receiving circuit are designed based on the port DQ2. Since the data received by different DQ ports suffers from different intersymbol interference, and the interference received by each data signal DQ in the transmission path is also different, different fourth control signals DfePerPin<1> and fifth control signals DfePerPin<0> are separately designed for the data signal DQ received by each DQ port, which is conducive to the targeted adjustment of each DQ port by the adjustment unit 1132, thereby further improving the receiving performance of the data receiving circuit. The DQ port is a port used by the data receiving circuit to receive the data signal DQ.

In the above embodiments, referring to FIG. 6 and FIG. 7, the different transistor groups may include: a first transistor group 13, a second transistor group 23, and a third transistor group 33 connected in parallel, where an equivalent channel aspect ratio of the first transistor group 13 is twice an equivalent channel aspect ratio of the second transistor group 23, and the equivalent channel aspect ratio of the second transistor group 23 is twice an equivalent channel aspect ratio of the third transistor group 33. In this way, the ratio of the equivalent resistance of the first transistor group 13, the equivalent resistance of the second transistor group 23, and the equivalent resistance of the third transistor group 33 is 1:2:4, such that the total equivalent resistance of the adjustment unit 1132 may be linearly adjustment, thereby linearly adjusting the voltage at the first node n_stg1 and the voltage at the second node p_stg1.

It should be noted that, the above description is only exemplified with the ratio of the equivalent channel aspect ratio of the first transistor group 13 to the equivalent channel aspect ratio of the second transistor group 23 being 2, and the ratio of the equivalent channel aspect ratio of the second transistor group 23 to the equivalent channel aspect ratio of the third transistor group 33 being 2. In practical applications, the ratio of the equivalent channel aspect ratio of the first transistor group 13 to the equivalent channel aspect ratio of the second transistor group 23, or the ratio of the equivalent channel aspect ratio of the second transistor group 23 to the equivalent channel aspect ratio of the third transistor group 33 may also be other number, such as 3 or 4.

It should be noted that, in FIG. 6, by controlling the channel aspect ratio of the first MOS transistor M01 to be twice the channel aspect ratio of the second MOS transistor M02, the equivalent channel aspect ratio of the first transistor group 13 is twice the equivalent channel aspect ratio of the second transistor group 23; and by controlling the channel aspect ratio of the second MOS transistor M02 to be twice the channel aspect ratio of the third MOS transistor M03, the equivalent channel aspect ratio of the second transistor group 23 is twice the equivalent channel aspect ratio of the third transistor group 33. In FIG. 7, by controlling the channel aspect ratio of the first MOS transistor M01 to be twice the channel aspect ratio of the second MOS transistor M02, the equivalent channel aspect ratio of the first transistor group 13 is twice the equivalent channel aspect ratio of the second transistor group 23; and by controlling the channel aspect ratio of the second MOS transistor M02, the channel aspect ratio of the third MOS transistor M03, and the channel aspect ratio of the fourth MOS transistor M04 to be the same, the channel aspect ratio of the second MOS transistor M02 is twice the equivalent channel aspect ratio of the third transistor group 33, that is, the equivalent channel aspect ratio of the second transistor group 23 is twice the equivalent channel aspect ratio of the third transistor group 33.

In addition, in FIG. 7, by controlling the channel aspect ratio of the fifth MOS transistor M05, the channel aspect ratio of the sixth MOS transistor M06, and the channel aspect ratio of the seventh MOS transistor M07 to be the same, the channel aspect ratio of the fifth MOS transistor M05 is twice the equivalent channel aspect ratio of the fifth transistor group 53, that is, the equivalent channel aspect ratio of the fourth transistor group 43 is twice the equivalent channel aspect ratio of the fifth transistor group 53. In some embodiments, the channel aspect ratio of the fifth MOS transistor M05 may also be equal to the channel aspect ratio of the second MOS transistor M02.

In one example, referring to FIG. 5, the channel length of the first MOS transistor M01, the channel length of the second MOS transistor M02, and the channel length of the third MOS transistor M03 may be equal; and the channel width of the first MOS transistor M01 may be twice the channel width of the second MOS transistor M02, and the channel width of the second MOS transistor M02 may be twice the channel width of the third MOS transistor M03. It should be noted that, in practical applications, when the width of the first MOS transistor M01, the width of the second MOS transistor M02, and the width of the third MOS transistor M03 are kept equal, by adjusting the ratio relationship of the channel length of the first MOS transistor M01, the channel length of the second MOS transistor M02, and the channel length of the third MOS transistor M03, or by adjusting the ratio relationship of the channel width of the first MOS transistor M01, the channel width of the second MOS transistor M02, and the channel width of the third MOS transistor M03, and adjusting the ratio relationship of the channel length of the first MOS transistor M01, the channel length of the second MOS transistor M02, and the channel length of the third MOS transistor M03, the ratio relationship of the equivalent channel aspect ratio of the first transistor group 13, the equivalent channel aspect ratio of the second transistor group 23, and the equivalent channel aspect ratio of the third transistor group 33 is implemented.

It should be noted that, the first MOS transistor M01, the second MOS transistor M02, the third MOS transistor M03, the fourth MOS transistor M04, the fifth MOS transistor M05, the sixth MOS transistor M06, and the seventh MOS transistor M07 may all be PMOS transistors or NMOS transistors. When any one of the first MOS transistor M01, the second MOS transistor M02, the third MOS transistor M03, the fourth MOS transistor M04, the fifth MOS transistor M05, the sixth MOS transistor M06, and the seventh MOS transistor M07 is a PMOS transistor, the phase of the control signal when the PMOS transistor is controlled to be in a turn-on state is a first phase. When the MOS transistor is an NMOS transistor, the phase of the control signal when the NMOS transistor is controlled to be in a turn-on state is a second phase. The first phase is opposite to the second phase.

In some other embodiments, referring to FIG. 9, the first internal node n_stg2 serves as the first feedback node, the second internal node p_stg2 serves as the second feedback node, and the feedback signal includes a first feedback signal fbn and a second feedback signal fbp. The decision feedback equalization module 103 may include: a first decision feedback unit 113 connected to the first internal node n_stg2 and the ground terminal, and configured to perform the decision feedback equalization on the first internal node n_stg2 on the basis of the first feedback signal fbn; and a second decision feedback unit 123 connected to the second internal node p_stg2 and the ground terminal, and configured to perform the decision feedback equalization on the second internal node p_stg2 on the basis of the second feedback signal fbp.

The first decision feedback unit 113 is configured to adjust the current in the third NMOS transistor MN3 to adjust the voltage at the first internal node n_stg2. The second decision feedback unit 123 is configured to adjust the current in the fourth NMOS transistor MN4 to adjust the voltage at the second internal node p_stg2.

It should be noted that, when the decision feedback equalization module 103 is connected to the first internal node n_stg2 and the second internal node p_stg2 in the second amplification module 102, the specific structure of the first decision feedback unit 113 and the specific structure of the second decision feedback unit 123 are similar to those shown in FIG. 6 and FIG. 7, except that the types of MOS transistors in the switch unit 1131 are different. For example, when the decision feedback equalization module 103 is connected to the first node n_stg1 and the second node p_stg1 in the first amplification module 101, the MOS transistors in the switch unit 1131 are PMOS transistors.

When the decision feedback equalization module 103 is connected to the first internal node n_stg2 and the second internal node p_stg2 in the second amplification module 102, the MOS transistors in the switch unit 1131 are NMOS transistors. The places that are the same as or corresponding to the foregoing descriptions are not repeated herein. The difference between when the decision feedback equalization module 103 is connected to the second amplification module 102 and when the decision feedback equalization module 103 is connected to the first amplification module 101 is described in detail below.

Referring to FIG. 9, any one of the first decision feedback unit 113 and the second decision feedback unit 123 includes: a switch unit 1131 configured to turn on the first internal node n_stg2 and the sixth node net6, or the second internal node p_stg2 and the sixth node net6 in response to the feedback signal; and an adjustment unit 1132 connected between the sixth node net6 and the ground terminal, and configured to adjust an equivalent resistance between the sixth node net6 and the ground terminal in response to the control signal. In the first decision feedback unit 113, the feedback signal is the first feedback signal fbn, and the switch unit 1131 turns on the first internal node n_stg2 and the sixth node net6 in response to the first feedback signal fbn; and in the second decision feedback unit 123, the feedback signal is the second feedback signal fbp, and the switch unit 1131 turns on the second internal node p_stg2 and the sixth node net6 in response to the second feedback signal fbp.

Still referring to FIG. 9, the switch unit 1131 may include: an eleventh NMOS transistor MN11 connected between the first internal node n_stg2 and the sixth node net6 and provided with a gate for receiving the first feedback signal fbn, or connected between the second internal node p_stg2 and the sixth node net6 and provided with a gate for receiving the second feedback signal fbp. It can be understood that, the eleventh NMOS transistor MN11 is equivalent to the fifth PMOS transistor MP5 in FIG. 6 and FIG. 7.

In one example, the first feedback signal fbn received by the switch unit 1131 in the first decision feedback unit 113 is at a low level, the eleventh NMOS transistor MN11 is turned on, and at this time, the adjustment unit 1132 adjusts the voltage at the first internal node n_stg2 on the basis of the control signal. The second feedback signal fbp received by the switch unit 1131 in the second decision feedback unit 123 is at a low level, the eleventh NMOS transistor MN11 is turned on, and at this time, the adjustment unit 1132 adjusts the voltage at the second internal node p_stg2 on the basis of the control signal.

It should be noted that, in FIG. 9, an example where the MOS transistors included in the adjustment unit 1132 are NMOS transistors is given. In practical applications, the specific structure of the adjustment unit 1132 is similar to that in the foregoing embodiments, and details are not repeated herein.

In some embodiments, referring to FIG. 4 to FIG. 9, the second amplification module 102 may include: an input unit 112 connected to the first node n_stg1 and the second node p_stg1, and configured to compare the first voltage signal and the second voltage signal, provide a third voltage signal to a seventh node n_stg2, and provide a fourth voltage signal to an eighth node p_stg2, where, the second amplification module 102 is provided with a first internal node n_stg2 and a second internal node p_stg2, the seventh node n_stg2 serves as the first internal node n_stg2, and the eighth node p_stg2 serves as the second internal node p_stg2; and a latch unit 122 configured to amplify and latch the third voltage signal and the fourth voltage signal, output the first output signal Vout to the third node net3, and output the second output signal VoutN to the fourth node net4.

The input unit 112 is configured to compare the first voltage signal and the second voltage signal to output the third voltage signal and the fourth voltage signal. The latch unit 122 is configured to output, according to the third voltage signal and the fourth voltage signal, a high-level signal to the third node net3 and a low-level signal to the fourth node net4, or output a low-level signal to the third node net3 and a high-level signal to the fourth node net4.

In some embodiments, referring to FIG. 5, FIG. 8, and FIG. 9, the input unit 112 may include: a third NMOS transistor MN3 connected between the seventh node n_stg2 and the ground terminal and provided with a gate for receiving the first voltage signal; and a fourth NMOS transistor MN4 connected between the eighth node p_stg2 and the ground terminal and provided with a gate for receiving the second voltage signal.

In one example, when the level of the first voltage signal outputted by the first node n_stg1 is higher than the level of the second voltage signal outputted by the second node p_stg1, the turn-on degree of the third NMOS transistor MN3 is greater than the turn-on degree of the fourth NMOS transistor MN4, such that when the voltage at the seventh node n_stg2 is less than the voltage at the eighth node p_stg2, the turn-on degree of the fifth NMOS transistor MN5 is greater than the turn-on degree of the sixth NMOS transistor MN6, and when the voltage at the third node net3 is less than the voltage at the fourth node net4, the turn-on degree of the seventh PMOS transistor MP7 is greater than the turn-on degree of the sixth PMOS transistor MP6. The latch unit 122 forms positive feedback amplification, further making the first output signal Vout outputted by the third node net3 at a low level, and making the second output signal VoutN outputted by the fourth node net4 at a high level.

In some embodiments, still referring to FIG. 5, FIG. 8, and FIG. 9, the latch unit 122 may include: a fifth NMOS transistor MN5 connected between the seventh node n_stg2 and the third node net3 and provided with a gate for receiving the second output signal VoutN; a sixth NMOS transistor MN6 connected between the eighth node p_stg2 and the fourth node net4 and provided with a gate for receiving the first output signal Vout; a sixth PMOS transistor MP6 connected between the power supply node Vcc and the third node net3 and provided with a gate for receiving the second output signal VoutN; and a seventh PMOS transistor MP7 connected between the power supply node Vcc and the fourth node net4 and provided with a gate for receiving the first output signal Vout.

In some embodiments, referring to FIG. 4, the second amplification module 102 may further include: a second reset unit 142 connected to the latch unit 122 and configured to reset the latch unit 122. Thus, after the data receiving circuit completes reception of the data signal DQ and the reference signal Vref and the output of the first output signal Vout and the second output signal VoutN once, the second reset unit 142 may reset the level at the third node net3 and the level at the fourth node net4 to an original value, such that the data receiving circuit subsequently performs next data reception and processing.

In some embodiments, still referring to FIG. 5, FIG. 8, and FIG. 9, the second reset unit 142 may include: an eighth PMOS transistor MP8 connected between the power supply node Vcc and the third node net3; and a ninth PMOS transistor MP9 connected between the power supply node Vcc and the fourth node net4, a gate of the eighth PMOS transistor MP8 and a gate of the ninth PMOS transistor MP9 both responding to an inverted signal CLK2 of the sampling clock signal CLK1.

In one example, when the sampling clock signal CLK1 and the enable signal SampEnN are at a low level, the first PMOS transistor MP1 and the second PMOS transistor MP2 are both turned on, and at this time, the first NMOS transistor MN1 and the second NMOS transistor MN2 are both turned off. When the inverted signal CLK2 of the sampling clock signal CLK1 is at a high level, the eighth PMOS transistor MP8 and the ninth PMOS transistor MP9 are both turned off, to ensure normal operation of the data receiving circuit. When the sampling clock signal CLK1 is at a high level, the first PMOS transistor MP1 is turned off, and this time, the first NMOS transistor MN1 and the second NMOS transistor MN2 are both turned on. When the inverted signal CLK2 of the sampling clock signal CLK1 is at a low level, the eighth PMOS transistor MP8 and the ninth PMOS transistor MP9 are both turned on, to pull up the voltage at the third node net3 and the voltage at the fourth node net4 to reset the third node net3 and the fourth node net4.

In some embodiments, referring to FIG. 8, on the basis that the second reset unit 142 includes the eighth PMOS transistor MP8 and the ninth PMOS transistor MP9, the second reset unit 142 may further include: a tenth PMOS transistor MP10 connected between the power supply node Vcc and the seventh node n_stg2; and an eleventh PMOS transistor MP11 connected between the power supply node Vcc and the eighth node p_stg2, a gate of the tenth PMOS transistor MP10 and a gate of the eleventh PMOS transistor MP11 both responding to the inverted signal CLK2 of the sampling clock signal CLK1. In this way, when the data receiving circuit does not need to receive the data signal DQ and the reference signal Vref, it is beneficial to further ensure that the voltage at the third node net3 and the voltage at the fourth node net4 are pulled up, to reset the third node net3 and the fourth node net4.

The specific connection relationship between the offset compensation module 104 and the second amplification module 102 is described in detail below.

In some embodiments, referring to FIG. 5, the first node n_stg1 serves as the first feedback node, and the second node p_stg1 serves as the second feedback node; and the data receiving circuit may further include: an offset compensation module 104 connected to the seventh node n_stg2 and the eighth node p_stg2 and configured to compensate for an offset voltage of the input unit 112.

In some embodiments, referring to FIG. 5, the offset compensation module 104 may include: a first offset compensation unit 114 connected between the seventh node n_stg2 and the ground terminal; and a second offset compensation unit 124 connected between the eighth node p_stg2 and the ground terminal. The first offset compensation unit 114 is configured to compensate for parameters of the third NMOS transistor MN3. The second offset compensation unit 124 is configured to compensate for parameters of the fourth NMOS transistor MN4. The first offset compensation unit 114 and the second offset compensation unit 124 may adjust the offset voltage of the data receiving circuit by compensating for the parameters of the third NMOS transistor MN3 and the parameters of the fourth NMOS transistor MN4.

In some embodiments, referring to FIG. 5, the first offset compensation unit 114 may include at least two transistor groups connected in parallel, where each of the transistor groups includes: a seventh NMOS transistor MN7 provided with a first terminal connected to the seventh node n_stg2 and a gate connected to the first node n_stg1; and a seventh MOS transistor M7 arranged in one-to-one correspondence with the seventh NMOS transistor MN7, connected between a second terminal of the seventh NMOS transistor MN7 and the ground terminal, and provided with a gate for receiving a first offset adjustment signal Offset_1. It should be noted that, for the simplicity of illustration, FIG. 5 only illustrates one transistor group in the first offset compensation unit 114.

In this way, the turn-on degree of the seventh NMOS transistor MN7 may be controlled by the first offset adjustment signal Offset_1 to adjust the overall equivalent resistance of the first offset compensation unit 114 to further adjust the voltage at the seventh node n_stg2.

In some embodiments, the first offset compensation unit 114 includes two transistor groups connected in parallel, where one transistor group includes a seventh-first NMOS transistor (not shown in the figure) and a seventh-first MOS transistor (not shown in the figure), and the other transistor group includes a seventh-second NMOS transistor (not shown in the figure) and a seventh-second MOS transistor (not shown in the figure). The first offset adjustment signal Offset_1 includes a third offset adjustment signal (not shown in the figure) and a fourth offset adjustment signal (not shown in the figure). A gate of the seventh-first NMOS transistor and a gate of the seventh-second NMOS transistor are connected to the first node n_stg1, a gate of the seventh-first MOS transistor receives the third offset adjustment signal, and a gate of the seventh-second MOS transistor receives the fourth offset adjustment signal.

The third offset adjustment signal and the fourth offset adjustment signal may be different. In this way, the turn-on degree of the seventh-first NMOS transistor and/or the turn-on degree of the seventh-second MOS transistor may be controlled on the basis of the third offset adjustment signal and the fourth offset adjustment signal to flexibly adjust the overall equivalent resistance of the first offset compensation unit 114, to further improve the adjustment effect on the voltage at the seventh node n_stg2.

In some embodiments, referring to FIG. 5, the second offset compensation unit 124 may include at least two transistor groups connected in parallel, where each of the transistor groups includes: an eighth NMOS transistor MN8 provided with a first terminal connected to the eighth node p_stg2 and a gate connected to the second node p_stg1; and an eighth MOS transistor M8 arranged in one-to-one correspondence with the eighth NMOS transistor MN8, connected between a second terminal of the eighth NMOS transistor MN8 and the ground terminal, and provided with a gate for receiving a second offset adjustment signal Offset_2. It should be noted that, for the simplicity of illustration, FIG. 5 only illustrates one transistor group in the second offset compensation unit 124.

In this way, the turn-on degree of the eighth NMOS transistor MN8 may be controlled by the second offset adjustment signal Offset_2 to adjust the overall equivalent resistance of the second offset compensation unit 124 to further adjust the voltage at the eighth node p_stg2.

In some embodiments, the second offset compensation unit 124 includes two transistor groups connected in parallel, where one transistor group includes an eighth-first NMOS transistor (not shown in the figure) and an eighth-first MOS transistor (not shown in the figure), and the other transistor group includes an eighth-second NMOS transistor (not shown in the figure) and an eighth-second MOS transistor (not shown in the figure). The second offset adjustment signal Offset_2 includes a fifth offset adjustment signal (not shown in the figure) and a sixth offset adjustment signal (not shown in the figure). A gate of the eighth-first NMOS transistor and a gate of the eighth-second NMOS transistor are connected to the first node n_stg1, a gate of the eighth-first MOS transistor receives the fifth offset adjustment signal, and a gate of the eighth-second MOS transistor receives the sixth offset adjustment signal.

The fifth offset adjustment signal and the sixth offset adjustment signal may be different. In this way, the turn-on degree of the eighth-first NMOS transistor and/or the turn-on degree of the eighth-second MOS transistor may be controlled on the basis of the fifth offset adjustment signal and the sixth offset adjustment signal to flexibly adjust the overall equivalent resistance of the second offset compensation unit 124, to further improve the adjustment effect on the voltage at the eighth node p_stg2.

It should be noted that, the seventh MOS transistor M7, the seventh-first MOS transistor, the seventh-second MOS transistor, the eighth MOS transistor M8, the eighth-first MOS transistor, and the eighth-second MOS transistor may all be PMOS transistors or NMOS transistors. When any of the MOS transistors is a PMOS transistor, and the PMOS transistor is turned on, the phase of the first offset adjustment signal Offset_1 is a third phase; and when the MOS transistors is an NMOS transistor, and the NMOS transistor is turned on, the phase of the second offset adjustment signal Offset_2 is a fourth phase. The third phase is opposite to the fourth phase.

The specific connection relationship between the offset compensation module 104 and the first amplification module 101 is described in detail below.

In some embodiments, the seventh node n_stg2 serves as the first feedback node, and the eighth node p_stg2 serves as the second feedback node. The data receiving circuit may further include: an offset compensation module 104 connected to the first node n_stg1 and the second node p_stg1 and configured to compensate for an offset voltage of the comparison unit 121.

The offset compensation module 104 may include: a first offset compensation unit 114 connected between the fifth node net5 and the first node n_stg1; and a second offset compensation unit 124 connected between the fifth node net5 and the second node p_stg1. The first offset compensation unit 114 is configured to compensate for parameters of the third PMOS transistor MP3. The second offset compensation unit 124 is configured to compensate for parameters of the fourth PMOS transistor MP4. The first offset compensation unit 114 and the second offset compensation unit 124 may adjust the offset voltage of the data receiving circuit by compensating for the parameters of the third PMOS transistor MP3 and the parameters of the fourth PMOS transistor MP4.

In some embodiments, referring to FIG. 8, the data receiving circuit may further include: a thirteen MOS transistor M1 provided with a gate for receiving the sampling clock signal CLK1, a drain connected to the fifth node net5, and a source connected to the ground terminal.

In conclusion, the decision feedback equalization module 103 is integrated in the data receiving circuit, which is beneficial to adjust the signals outputted by the data receiving circuit using a smaller circuit layout area and lower power consumption. Moreover, the adjustment capability of the decision feedback equalization module 103 provided in the embodiments of the present disclosure to the first output signal Vout and the second output signal VoutN is adjustable. It can be understood that, when the data signal DQ and/or the reference signal Vref received by the receiving module 100 change, the adjustment capability of the decision feedback equalization module 103 to the first output signal Vout and the second output signal VoutN may be flexibly controlled, to reduce the intersymbol interference in the data receiving circuit, thereby improving the receiving performance of the data receiving circuit.

Another embodiment of the present disclosure provides a data receiving system. The data receiving system provided by another embodiment of the present disclosure will be described in detail below with reference to the accompanying drawings. FIG. 1 is a functional block diagram of a data receiving system according to another embodiment of the present disclosure.

Figure 2:
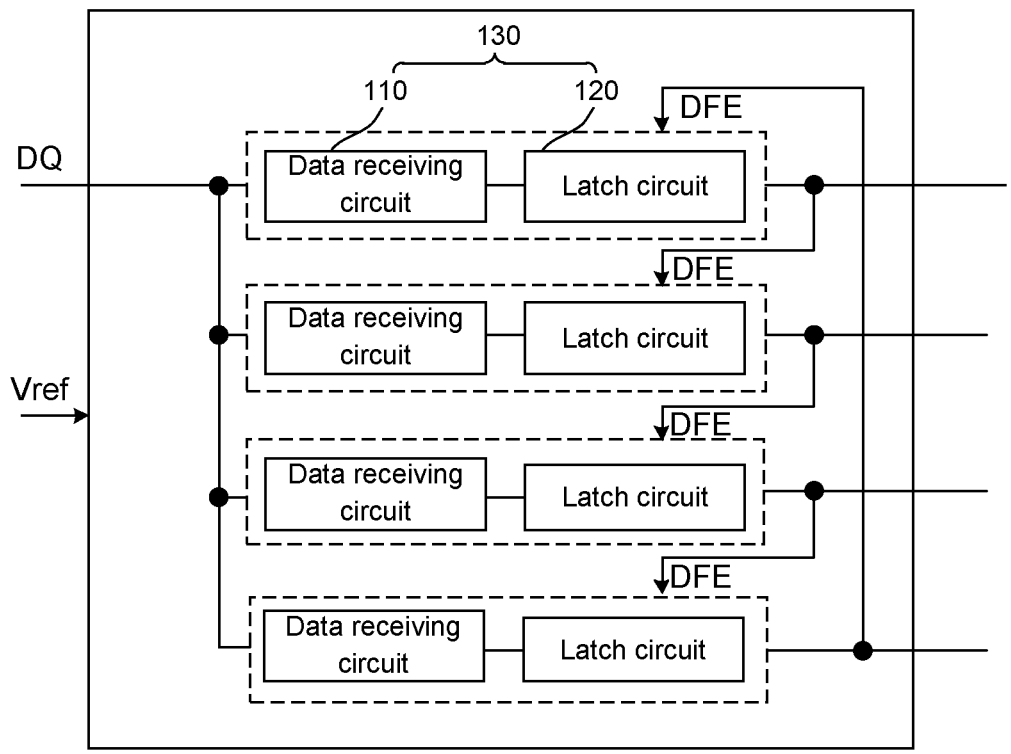
FIG. 2 is a functional block diagram of a data receiving system according to another embodiment of the present disclosure.

Referring to FIG. 2, the data receiving system includes: a plurality of cascaded data transmission circuits 130, where each of the data transmission circuits 130 includes the data receiving circuit 110 according to one embodiment of the present disclosure and a latch circuit 120 connected to the data receiving circuit 110, and the data receiving circuit 110 is connected to a data port for receiving the data signal DQ; a previous-stage data transmission circuit 130 is connected to the decision feedback equalization module DFE of a next-stage data transmission circuit 130, and output of the previous-stage data transmission circuit 130 serves as the feedback signal of the decision feedback equalization module DFE of the next-stage data transmission circuit 130; and a last-stage data transmission circuit 130 is connected to the decision feedback equalization module DFE of a first-stage data transmission circuit 130, and output of the last-stage data transmission circuit 130 serves as the feedback signal of the decision feedback equalization module DFE of the first-stage data transmission circuit 130.

The latch circuits 120 and the data receiving circuits 110 are arranged in one-to-one correspondence, and the latch circuits 120 are configured to latch and output signals outputted by the data receiving circuits 110 corresponding to the latch circuits 120.

It should be noted that, the output of any data transmission circuit 130 may include the following two situations: in some embodiments, the output of the data transmission circuit 130 refers to the output of the data receiving circuit 110. It can be understood that, the output of the previous-stage data receiving circuit 110 serves as the feedback signal of the decision feedback equalization module DFE of the next-stage data receiving system, and the output of the last-stage data receiving circuit 110 serves as the feedback signal of the decision feedback equalization module DFE of the first-stage data receiving system. In this way, the output of the data receiving circuit 110 is directly transmitted to the decision feedback equalization module DFE, without passing through the latch circuit 120, which is beneficial to reduce the transmission delay of data. In some other embodiments, the output of the data transmission circuit 130 refers to the output of the latch circuit 120. It can be understood that, the output of the previous-stage data receiving circuit 110 is latched by the latch circuit 120 corresponding to this-stage data receiving circuit 110, and then is connected to the decision feedback equalization module DFE of the next-stage data receiving system through the output terminal of the latch circuit 120. That is, the output of the previous-stage latch circuit 120 serves as the feedback signal of the decision feedback equalization module DFE of the next-stage data receiving system, and the output of the last-stage latch circuit 120 serves as the feedback signal of the decision feedback equalization module DFE of the first-stage data receiving system.

It should be noted that, in FIG. 1, taking an example where the data receiving system includes four cascaded data receiving circuits 110, and the sampling clock signals of adjacent stages of the data receiving circuits 110 have a phase difference of 90 degrees, in practical applications, the number of the cascaded data receiving circuits 110 included in the data receiving system is not limited, and the phase difference of the sampling clock signals of adjacent stages of data receiving circuits 110 may be reasonably set on the basis of the number of the cascaded data receiving circuits 110.

In some embodiments, the sampling clock signals of two adjacent stages of the data receiving circuits 110 have a phase difference of 90 degrees, and the cycle of the sampling clock signal is twice the cycle of the data signal DQ received by the data port, thus facilitating clock routing and saving power consumption.

In conclusion, in the data receiving system according to another embodiment of the present disclosure, the adjustment capability to the first output signal Vout and the second output signal VoutN may be flexibly controlled, to reduce the influence of the intersymbol interference of the data received by the data receiving circuit 110 on the data receiving circuit 110, improve the receiving performance of the data receiving circuit 110, and reduce the influence of the intersymbol interference of the data on the accuracy of the signals outputted by the data receiving circuit 110, thereby improving the receiving performance of the data receiving system.

Another embodiment of the present disclosure further provides a memory device, including: a plurality of data ports; and a plurality of the data receiving systems according to another embodiment of the present disclosure, where each of the data receiving systems corresponds to one of the data ports. Thus, each of the data ports in the memory device may flexibly adjust the received data signal DQ through the data receiving system, to improve the adjustment capability to the first output signal Vout and the second output signal VoutN, thereby improving the receiving performance of the memory device.

In some embodiments, the memory device may be a DDR memory, such as a DDR4 memory, a DDR5 memory, a DDR6 memory, a LPDDR4 memory, a LPDDR5 memory, or a LPDDR6 memory.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the data receiving circuit, the data receiving system, and the memory device provided in the embodiments of the present disclosure, the decision feedback equalization module is integrated in the data receiving circuit, and is configured to adjust the first output signal and the second output signal to reduce the influence of the intersymbol interference on the data reception. The embodiments of the present disclosure are beneficial to adjust the signals outputted by the data receiving circuit using a smaller circuit layout area and lower power consumption, and reduce, by flexibly controlling the adjustment capability of the decision feedback equalization module to the first output signal and the second output signal, the influence of the intersymbol interference of the data received by the data receiving circuit on the data receiving circuit, thereby improving the receiving performance of the data receiving circuit, and reducing the influence of the intersymbol interference of the data on the accuracy of the signals outputted by the data receiving circuit.

The invention claimed is:

1. A data receiving circuit, comprising:
    a receiving module, configured to receive a data signal and a reference signal, compare the data signal and the reference signal in response to a sampling clock signal, and output a first output signal and a second output signal; and
    a decision feedback equalization module, connected to a feedback node of the receiving module, and configured to perform a decision feedback equalization on the receiving module on the basis of a feedback signal to adjust the first output signal and the second output signal, wherein the feedback signal is obtained on the basis of data received previously, and an adjustment capability of the decision feedback equalization module to the first output signal and the second output signal is adjustable; and, wherein the receiving module comprises:

a first amplification module, configured to receive the data signal and the reference signal, compare the data signal and the reference signal in response to the sampling clock signal, output a first voltage signal through a first node, and output a second voltage signal through a second node;

a second amplification module, connected to the first node and the second node, and configured to amplify a voltage difference between the first voltage signal and the second voltage signal, output the first output signal through a third node, and output the second output signal through a fourth node; and the feedback node comprises a first feedback node and a second feedback node, the first node serves as the first feedback node, the second node serves as the second feedback node, and the decision feedback equalization module is configured to perform the decision feedback equalization on the first node and the second node on the basis of the feedback signal to adjust the first voltage signal and the second voltage signal.

2. The data receiving circuit according to claim 1, further comprising: an offset compensation module, connected to the second amplification module, and configured to compensate for an offset voltage of the second amplification module.

3. A data receiving circuit, comprising:

a receiving module, configured to receive a data signal and a reference signal, compare the data signal and the reference signal in response to a sampling clock signal, and output a first output signal and a second output signal; and a decision feedback equalization module, connected to a feedback node of the receiving module, and configured to perform a decision feedback equalization on the receiving module on the basis of a feedback signal to adjust the first output signal and the second output signal, wherein the feedback signal is obtained on the basis of data received previously, and an adjustment capability of the decision feedback equalization module to the first output signal and the second output signal is adjustable; and wherein the receiving module comprises:

a first amplification module, configured to receive the data signal and the reference signal, compare the data signal and the reference signal in response to the sampling clock signal, output a first voltage signal through a first node, and output a second voltage signal through a second node;

a second amplification module, connected to the first node and the second node, configured to amplify a voltage difference between the first voltage signal and the second voltage signal, output the first output signal through a third node and output the second output signal through a fourth node, and provided with a first internal node and a second internal node, the first output signal and the second output signal being obtained on the basis of a signal of the first internal node and a signal of the second internal node; and the feedback node comprises a first feedback node and a second feedback node, the first internal node serves as the first feedback node, the second internal node serves as the second feedback node, and the decision feedback equalization module is configured to perform the decision feedback equalization on the first internal node and the second internal node on the basis of the feedback signal.

4. The data receiving circuit according to claim 3, further comprising: an offset compensation module, connected to the first amplification module, and configured to compensate for an offset voltage of the first amplification module.

5. The data receiving circuit according to claim 1, wherein the first amplification module comprises:

a current source, connected between a power supply node and a fifth node and configured to provide a current to the fifth node in response to the sampling clock signal; and a comparison unit, connected to the fifth node, the first node, and the second node, and configured to receive the data signal and the reference signal, compare the data signal and the reference signal when the current source provides the current to the fifth node in response to the sampling clock signal, output the first voltage signal through the first node, and output the second voltage signal through the second node.

6. The data receiving circuit according to claim 5, wherein the current source comprises:

a first P-channel metal oxide semiconductor (PMOS) transistor, connected between the power supply node and the fifth node, and provided with a gate for receiving the sampling clock signal.

7. The data receiving circuit according to claim 6, wherein the current source further comprises:

a second PMOS transistor, connected between the power supply node and the first PMOS transistor, and provided with a gate for receiving an enable signal.

8. The data receiving circuit according to claim 6, wherein the comparison unit comprises:

a third PMOS transistor, connected between the fifth node and the first node, and provided with a gate for receiving the data signal; and a fourth PMOS transistor, connected between the fifth node and the second node, and provided with a gate for receiving the reference signal.

9. The data receiving circuit according to claim 6, wherein the first amplification module further comprises:

a first reset unit, connected to the first node and the second node, and configured to reset the first node and the second node; and the first reset unit comprises:

a first N-channel metal oxide semiconductor (NMOS) transistor, connected between the first node and a ground terminal, and provided with a gate for receiving the sampling clock signal; and a second NMOS transistor, connected between the second node and the ground terminal, and provided with a gate for receiving the sampling clock signal.

10. The data receiving circuit according to claim 5, wherein the first node serves as the first feedback node, the second node serves as the second feedback node, and the feedback signal comprises a first feedback signal and a second feedback signal; and the decision feedback equalization module comprises:

a first decision feedback unit, connected to the first node and the fifth node, and configured to perform a decision feedback equalization on the first node on the basis of the first feedback signal to adjust the first voltage signal; and a second decision feedback unit, connected to the second node and the fifth node, and configured to perform a decision feedback equalization on the second node on the basis of the second feedback signal to adjust the second voltage signal.

11. The data receiving circuit according to claim 10, wherein any one of the first decision feedback unit and the second decision feedback unit comprises:

a switch unit, configured to turn on the fifth node and a sixth node in response to a feedback signal; and an adjustment unit, connected between the sixth node and an output node as one of the first node and the second node, and configured to adjust an equivalent resistance between the sixth node and the output node in response to control signals;

wherein, in the first decision feedback unit, the feedback signal is the first feedback signal, the output node is the first node, and the switch unit responds to the first feedback signal;

and in the second decision feedback unit, the feedback signal is the second feedback signal, the output node is the second node, and the switch unit responds to the second feedback signal.

12. The data receiving circuit according to claim 11, wherein the switch unit comprises:

a fifth P-channel metal oxide semiconductor (PMOS) transistor, connected between the fifth node and the sixth node, and provided with a gate for receiving the feedback signal.

13. The data receiving circuit according to claim 12, wherein the adjustment unit comprises:

a plurality of transistor groups connected in parallel between the sixth node and the output node, wherein control terminals of different transistor groups receive different control signals, and the different transistor groups have different equivalent resistances.

14. The data receiving circuit according to claim 13, wherein the different transistor groups comprise:

at least one of the transistor groups comprising a single metal oxide semiconductor (MOS) transistor; and at least one of the transistor groups comprising at least two MOS transistors connected in series.

15. The data receiving circuit according to claim 14, wherein the different transistor groups comprise:

a first transistor group, a second transistor group, and a third transistor group connected in parallel, wherein an equivalent channel aspect ratio of the first transistor group is twice an equivalent channel aspect ratio of the second transistor group, and the equivalent channel aspect ratio of the second transistor group is twice an equivalent channel aspect ratio of the third transistor group.

16. The data receiving circuit according to claim 1, wherein the second amplification module comprises:

an input unit, connected to the first node and the second node, and configured to compare the first voltage signal and the second voltage signal, provide a third voltage signal to a seventh node, and provide a fourth voltage signal to an eighth node, wherein, the second amplification module is provided with a first internal node and a second internal node, the seventh node serves as the first internal node, and the eighth node serves as the second internal node; and a latch unit, configured to amplify and latch the third voltage signal and the fourth voltage signal, output the first output signal to the third node, and output the second output signal to the fourth node.

17. The data receiving circuit according to claim 16, wherein the input unit comprises:

a third N-channel metal oxide semiconductor (NMOS) transistor, connected between the seventh node and a ground terminal, and provided with a gate for receiving the first voltage signal; and a fourth NMOS transistor, connected between the eighth node and the ground terminal, and provided with a gate for receiving the second voltage signal; and the latch unit comprises:

a fifth NMOS transistor, connected between the seventh node and the third node, and provided with a gate for receiving the second output signal;

a sixth NMOS transistor, connected between the eighth node and the fourth node, and provided with a gate for receiving the first output signal;

a sixth P-channel metal oxide semiconductor (PMOS) transistor, connected between a power supply node and the third node, and provided with a gate for receiving the second output signal; and a seventh PMOS transistor, connected between the power supply node and the fourth node, and provided with a gate for receiving the first output signal.

18. The data receiving circuit according to claim 16, wherein the first node serves as the first feedback node, and the second node serves as the second feedback node; and the data receiving circuit further comprises:

an offset compensation module, connected to the seventh node and the eighth node, and configured to compensate for an offset voltage of the input unit;

wherein the offset compensation module comprises:

a first offset compensation unit, connected between the seventh node and a ground terminal; and a second offset compensation unit, connected between the eighth node and the ground terminal.

19. The data receiving circuit according to claim 18, wherein the first offset compensation unit comprises:

at least two transistor groups connected in parallel, wherein each of the transistor groups comprises:

a seventh N-channel metal oxide semiconductor (NMOS) transistor, provided with a first terminal connected to the seventh node and a gate connected to the first node; and a seventh metal oxide semiconductor (MOS) transistor, arranged in one-to-one correspondence with the seventh NMOS transistor, connected between a second terminal of the seventh NMOS transistor and the ground terminal, and provided with a gate for receiving a first offset adjustment signal; and the second offset compensation unit comprises:

at least two transistor groups connected in parallel, wherein each of the transistor groups comprises:

an eighth NMOS transistor, provided with a first terminal connected to the eighth node and a gate connected to the second node; and an eighth MOS transistor, arranged in one-to-one correspondence with the eighth NMOS transistor, connected between a second terminal of the eighth NMOS transistor and the ground terminal, and provided with a gate for receiving a second offset adjustment signal.

20. The data receiving circuit according to claim 16, wherein the second amplification module further comprises:

a second reset unit, connected to the latch unit, and configured to reset the latch unit;

the second reset unit comprises:

an eighth P-channel metal oxide semiconductor (PMOS) transistor, connected between a power supply node and the third node; and a ninth PMOS transistor, connected between the power supply node and the fourth node, a gate of the eighth PMOS transistor and a gate of the ninth PMOS transistor both responding to an inverted signal of the sampling clock signal; and the second reset unit further comprises:

a tenth PMOS transistor, connected between the power supply node and the seventh node; and an eleventh PMOS transistor, connected between the power supply node and the eighth node, a gate of the tenth PMOS transistor and a gate of the eleventh PMOS transistor both responding to the inverted signal of the sampling clock signal.

21. The data receiving circuit according to claim 3, wherein the first internal node serves as the first feedback node, the second internal node serves as the second feedback node, and the feedback signal comprises a first feedback signal and a second feedback signal; and the decision feedback equalization module comprises:

a first decision feedback unit, connected to the first internal node and a ground terminal, and configured to perform a decision feedback equalization on the first internal node on the basis of the first feedback signal; and a second decision feedback unit, connected to the second internal node and the ground terminal, and configured to perform a decision feedback equalization on the second internal node on the basis of the second feedback signal.

22. A data receiving system, comprising:

a plurality of cascaded data transmission circuits, wherein each of the data transmission circuits comprises the data receiving circuit according to claim 1 and a latch circuit connected to the data receiving circuit, and the data receiving circuit is connected to a data port for receiving a data signal; a previous-stage data transmission circuit is connected to a decision feedback equalization module of a next-stage data transmission circuit, and an output of the previous-stage data transmission circuit serves as a feedback signal of the decision feedback equalization module of the next-stage data transmission circuit; and a last-stage data transmission circuit is connected to a decision feedback equalization module of a first-stage data transmission circuit, and an output of the last-stage data transmission circuit serves as a feedback signal of the decision feedback equalization module of the first-stage data transmission circuit.

23. A memory device, comprising:

a plurality of data ports; and a plurality of the data receiving systems according to claim 22, wherein each of the data receiving systems corresponds to one of the data ports.

* * * * *